(12) United States Patent
Li et al.

(10) Patent No.: US 12,317,763 B2
(45) Date of Patent: May 27, 2025

(54) MEMORY CELL WITH COMB-SHAPED ELECTRODES

(71) Applicant: INTERNATIONAL BUSINESS MACHINES CORPORATION, Armonk, NY (US)

(72) Inventors: Juntao Li, Cohoes, NY (US); Kangguo Cheng, Schenectady, NY (US); Carl Radens, LaGrangeville, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 692 days.

(21) Appl. No.: 17/453,346

(22) Filed: Nov. 3, 2021

(65) Prior Publication Data
US 2023/0133058 A1    May 4, 2023

(51) Int. Cl.
*H10N 70/00*  (2023.01)
*H10B 63/00*  (2023.01)
*H10N 70/20*  (2023.01)

(52) U.S. Cl.
CPC ........... *H10N 70/841* (2023.02); *H10B 63/30* (2023.02); *H10B 63/80* (2023.02); *H10N 70/011* (2023.02); *H10N 70/231* (2023.02)

(58) Field of Classification Search
CPC .............................. H10N 70/00; H10B 63/00
See application file for complete search history.

(56) References Cited

U.S. PATENT DOCUMENTS

| | | |
|---|---|---|
| 7,989,920 B2 | 8/2011 | Lee |
| 8,049,202 B2 | 11/2011 | Khang |
| 8,084,789 B2 | 12/2011 | Pellizzer |
| 8,236,602 B2 | 8/2012 | Chang |
| 8,293,650 B2 | 10/2012 | Chang |
| 8,642,990 B2 | 2/2014 | Li |

(Continued)

FOREIGN PATENT DOCUMENTS

| | | |
|---|---|---|
| CN | 101471131 A | 7/2009 |
| KR | 100687755 B1 | 2/2007 |
| WO | 2016043657 A1 | 3/2016 |

OTHER PUBLICATIONS

Oh et al., "Parallel Multi-Confined (PMC) Cell Technology for High Density MLC PRAM", 2009 Symposium on VLSI Technology Digest of Technical Papers, pp. 220-221.

(Continued)

*Primary Examiner* — Marvin Payen
(74) *Attorney, Agent, or Firm* — Samuel A. Waldbaum

(57) ABSTRACT

A structure including a bottom electrode on a substrate, a first side electrode vertically aligned above the bottom electrode, a set of alternating layers of insulator layers and conductive layers horizontally adjacent to the first side electrode, and a resistance switching material layer, the resistance switching material layer horizontally adjacent to a first side of the set of alternating layers. A method including forming a structure, the structure including alternating layers of insulator layers and conductive layers on a substrate, the substrate including a bottom electrode, removing a vertically aligned portion of the alternating layers forming a first trench, forming a first side electrode adjacent to the alternating layers in a portion of the first trench, removing another vertically aligned portion of the alternating layers forming a second trench, and forming a resistance switching material layer in the second trench.

11 Claims, 11 Drawing Sheets

(56) References Cited

U.S. PATENT DOCUMENTS

| | | |
|---|---|---|
| 9,312,481 B2 | 4/2016 | Boniardi |
| 9,419,058 B1 | 8/2016 | Takaki |
| 2006/0121391 A1 | 6/2006 | Khang |
| 2009/0146127 A1 | 6/2009 | Huang |
| 2010/0163832 A1 | 7/2010 | Kau |
| 2011/0121250 A1 | 5/2011 | Lee |

OTHER PUBLICATIONS

Pending U.S. Appl. No. 17/118,664, filed Dec. 11, 2020, entitled: "Phase Change Memory Cell With Ovonic Threshold Switch", 25 pages.

MEMORY CELL WITH COMB-SHAPED ELECTRODES

BACKGROUND

The present invention relates generally to a memory cell, and more particularly, to a memory cell with comb-shaped electrodes.

A memory cell may be used for data storage. The memory cell is a non-volatile random-access memory. A typical configuration of a memory cell may include a resistive switching material arranged between, and coupled to, at least two electrodes. When the memory cell is in use, the resistive switching material may be operated in a reversibly transformable phases, an amorphous phase and a crystalline phase. The amorphous phase and the crystalline phase are distinct from one another. In the amorphous phase, the resistive switching material has a discernibly higher resistance when compared to the crystalline phase. When the resistive switching material is in a crystalline state, the resistive switching material has a high conductivity and a low resistivity (which corresponds to a logical 1), allowing current to travel quickly thorough the resistive switching material and between electrodes. When the resistive switching material is in an amorphous state, the resistive switching material has a low conductivity and a high resistivity (which corresponds to a logical 0), preventing current from travelling quickly through the resistive switching material and between the electrodes. Data is stored using the contrast between resistances of the multiple states. Having these multiple states allows the memory cell to be a non-volatile memory, as the states can remain when power is removed, allowing the resistive switching material to retain data even when there is no power. In order to facilitate a phase transition, energy is supplied to the resistive switching material such as, for example, electrical energy, thermal energy, any other suitable form of energy or combination thereof that may effectuate a desired phase transition.

Current is applied to a resistive switching material cell between a bottom electrode, or a bit line, below the resistive switching material memory cell, and a top electrode, or a word line, to set the resistive switching material to the amorphous phase or the crystalline phase. Traditionally, each of the bottom electrode and the top electrode form a continuous contact between the electrode and the resistive switching material of the resistive switching material memory cell.

SUMMARY

According to an embodiment of the present invention, a structure is provided. The structure may include a bottom electrode on a substrate, a first side electrode vertically aligned above the bottom electrode, a set of alternating layers of insulator layers and conductive layers horizontally adjacent to the first side electrode, and a resistance switching material layer, the resistance switching material layer horizontally adjacent to a first side of the set of alternating layers.

According to an embodiment of the present invention, a structure is provided. The structure may include a first set of alternating layers of insulator layers and conductive layers on a first side of a resistance switching material layer and a second set of alternating layers of insulator layers and conductive layers on a second side of the resistance switching material layer, a first side electrode adjacent to the first set of alternating layers and vertically aligned above a bottom electrode, and a second side electrode adjacent to the second set of alternating layers and vertically aligned below a top electrode.

According to an embodiment of the present invention, a method is provided. The method may include forming a structure, the structure including alternating layers of insulator layers and conductive layers on a substrate, the substrate including a bottom electrode, removing a vertically aligned portion of the alternating layers forming a first trench, forming a first side electrode adjacent to the alternating layers in a portion of the first trench, removing another vertically aligned portion of the alternating layers forming a second trench, and forming a resistance switching material layer in the second trench.

BRIEF DESCRIPTION OF THE DRAWINGS

The following detailed description, given by way of example and not intend to limit the invention solely thereto, will best be appreciated in conjunction with the accompanying drawings, in which.

Figure 1:
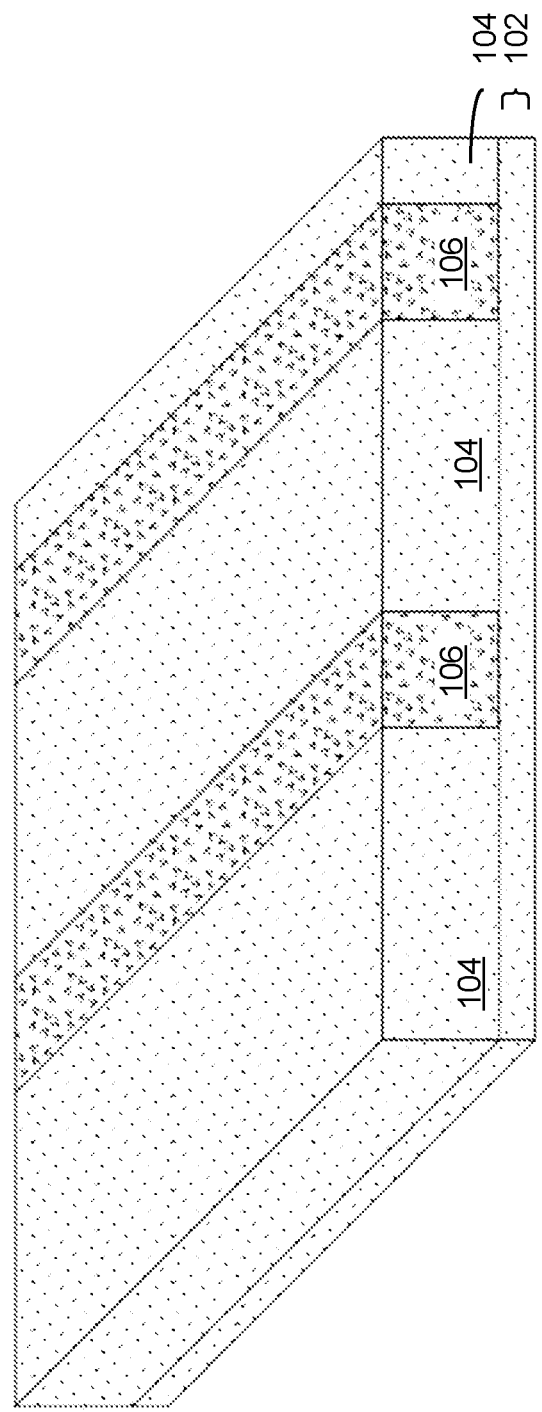
FIG. 1 illustrates an isometric view of a semiconductor structure at an intermediate stage of fabrication, according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention generally relate to a resistive switching material memory cell, and more particularly, to a resistive switching material memory cell with comb-shaped electrodes. The comb-shaped electrodes are formed from the conductive layers of alternating layers of insulator layers and conductive layers (teeth portion of a comb shape) connected to a side electrode (shaft portion of a comb shape) on either side of a resistive switching material layer, which are connected to a bottom electrode on one side of the resistive switching material memory cell, and are connected to a top electrode on another side of the resistive switching material memory cell. The resistive switching material memory cell may store memory states due to differences in resistivity between the resistive switching material layer crystalline phase which is a low resistive state, and the amorphous phase which is a high resistive state. A resistive switching material memory cell may be selected by providing power to a bottom electrode and a top electrode of the particular individual resistive switching material memory cell. Current may flow between the bottom electrode and the top electrode allowing for the current to pass through the resistive switching material layer, to the top electrode. Differences in a resulting current, due to the resistive switching material layer being in either the low resistive state or the high resistive state, allow for determination of different memory states.

The resistive switching material memory includes the bottom electrode and the top electrode with a resistive switching material between the two. In an embodiment, the resistive switching material may be a phase change material (PCM). Conventional phase change memories (PCMs) and their corresponding phase change materials have two states—amorphous and crystalline. The amorphous state may be referred to as a RESET state and the crystalline state may be referred to as a SET state. To switch the phase change material between the two states, the PCM may also include a heater (sometimes called the bottom electrode contact) that sends current pulses through the heater (from the electrode) and into the phase change material. When the phase change material is in a crystalline state, the heater may convert the material into an amorphous state by sending short high current pulses to rapidly heat the phase change material and then quenching or cooling it. When the phase change material is in an amorphous state, the heater may convert the material into a crystalline state by sending a longer, but lower current, pulse(s) to heat the phase change material to a crystallization temperature for a prolonged period of time (without cooling the material) to allow for the material to become crystalline. A conductance of the phase change memory cell is a sum of conductance of each of the conductive layers contacting the phase change memory cell, where each of the conductive layers may be equivalent to a resistor and all of the teeth of the conductive layers may be equivalent to multiple resistors in parallel. An advantage of teeth of the comb shape electrode contacting the phase change material is that the total conductance of the phase change material changes gradually as phase change material adjacent to each tooth of the comb electrode can be subjected to phase change differently. As a result, the total conductance of each phase change memory cell can change gradually rather than abruptly, rendering it more suitable for analog computing.

In an embodiment, the resistive switch material memory may store more than one memory bit per individual cell. Each individual cell may have multiple resistance levels per cell, where each resistance level per cell may identify a memory state.

The present disclosure provides a comb-shaped heater electrode used for gradually changing the conductance of the resistive switching material memory through a comb-shaped heater electrode. The comb-shaped heater electrode may have multiple layers of heating material (i.e., heating layers), and each heating layer may be separated by an insulator layer. Each heating layer thickness can be the same or can be different than the other heating layers. The thickness of each heating layer can be controlled by a thickness of each conductive layer, which also can vary per layer. In addition, the conductive of each conductive (or heating) layer can be different from each other as well, for example, by using different materials for each conductive (or heating) layer. Using layers with different properties allows the multiple heating layers (in the comb-shaped heater electrode) to act similar to having multiple PCMs in parallel. This allows for each individual heating layer to have different levels of conductance and/or resistance, which then transfers different amounts of heat to different areas of the PCM.

For example, for a comb-shaped electrode with identical heating layers (same material, same thickness), as the programing current begins to flow through the multiple heating layers and is spread out over a surface of the phase change material, a specific heating layer may rapidly heat the phase change material in the area near the specific heating layer (due to the intrinsic randomness associated with write process), which may change the phase change material in this area from a crystalline solid to an amorphous solid (as crystalline solids may be converted to amorphous solids by rapidly heating them and then quenching or cooling them). This way, when one portion of the phase change material (of the PCM) is RESET to an amorphous state with high resistance, other portions of the phase change material may still be in a crystalline state. Similarly, a consecutive current pulse may switch a portion of phase change material adjacent to another heating layer into amorphous phase, and so on. This way we can achieve more multiple resistance levels. In another example, for the multiple heating layer with various resistance (by adjusting the layer thickness or material resistivity), a heating layer with a high conductance may rapidly heat the phase change material in the area near the specific heating layer (as greater amounts of current flow are travelling through the specific heating layer, therefore generating more heat), which may change the phase change material in this area from a crystalline solid to an amorphous solid (as crystalline solids may be converted to amorphous solids by rapidly heating them and then quenching or cooling them). This way, when one portion of the phase change material (of the PCM) is RESET to an amorphous state with high resistance, other portions of the phase change material may still be in a crystalline state due to the amount of heat and conductance from heating layers near those portions of the phase change material. Amorphous solids may be converted to crystalline solids by keeping the material (for example, the phase change material) at a crystallization temperature for a prolonged period of time, or at least enough time for the material to become crystallized, without cooling the material. Through the multiple comb-shaped heating electrode, there may be more phases (such as intermediate phases with both crystalline and amorphous areas) and the transitions between phases of the phase change material is more gradual, which will be beneficial for PCM applications such as cognitive computing, neuromorphic applications, etc.).

A read process and be performed at the end of the either SET or RESET process. The read process apply a current pulse having relative low amplitude to sense the final cell resistance without interfering the phase change material (no large amount of heat will be generated to change the phase of the phase change material).

Referring now to FIG. 1, a structure 100 is shown at an intermediate step of fabrication, according to an embodiment. The structure 100 may include an underlayer 102, an interlayer dielectric (hereinafter "ILD") 104 and a bottom electrode 106.

The underlayer 102 may be a silicon substrate with layers of connections and structures, such as, for example, transistors and isolations built on it. The silicon substrate may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the underlayer 102 may be approximately, but is not limited to, several hundred microns thick.

The ILD 104 may be blanket deposited on top of the structure 100, and directly on a top surface of the underlayer 102. The ILD 104 can be deposited using any known deposition techniques, such as, for example, chemical vapor deposition, atomic layer deposition, physical layer deposition, or some combination thereof. The ILD 104 may include materials, such as, for example, an oxide, a nitride, or some combination thereof. In an embodiment, the ILD 104 may include an oxide, such as, silicon oxide. In an alternate embodiment, the ILD 104 may include a nitride, such as, silicon nitride. A chemical mechanical planarization (hereinafter "CMP") technique may optionally be used to polish the ILD 104 provide a substantially smooth and uniform surface in preparation for subsequent processing techniques.

The bottom electrode 106 may be deposited within a trench (not shown) formed in the ILD 104. The bottom electrode 106 may be formed from a conductive material layer, such as, for example, copper, tungsten, cobalt, or aluminum. The conductive material layer may be deposited using typical deposition techniques, for example, atomic layer deposition, molecular layer deposition, and chemical vapor deposition. In an embodiment, the bottom electrode 106 may have a thickness ranging from about 10 nm to about 100 nm, although a thickness less than 10 nm and greater than 100 nm may be acceptable. As shown in FIG. 1, there are two bottom electrodes 106, however, there may be any number of bottom electrodes 106 in the structure 100. A CMP technique may optionally be used to polish the structure 100 such that upper surfaces of the bottom electrode 106 and the ILD 104 are substantially coplanar and provide a substantially smooth and uniform surface in preparation for subsequent processing techniques.

Figure 2:
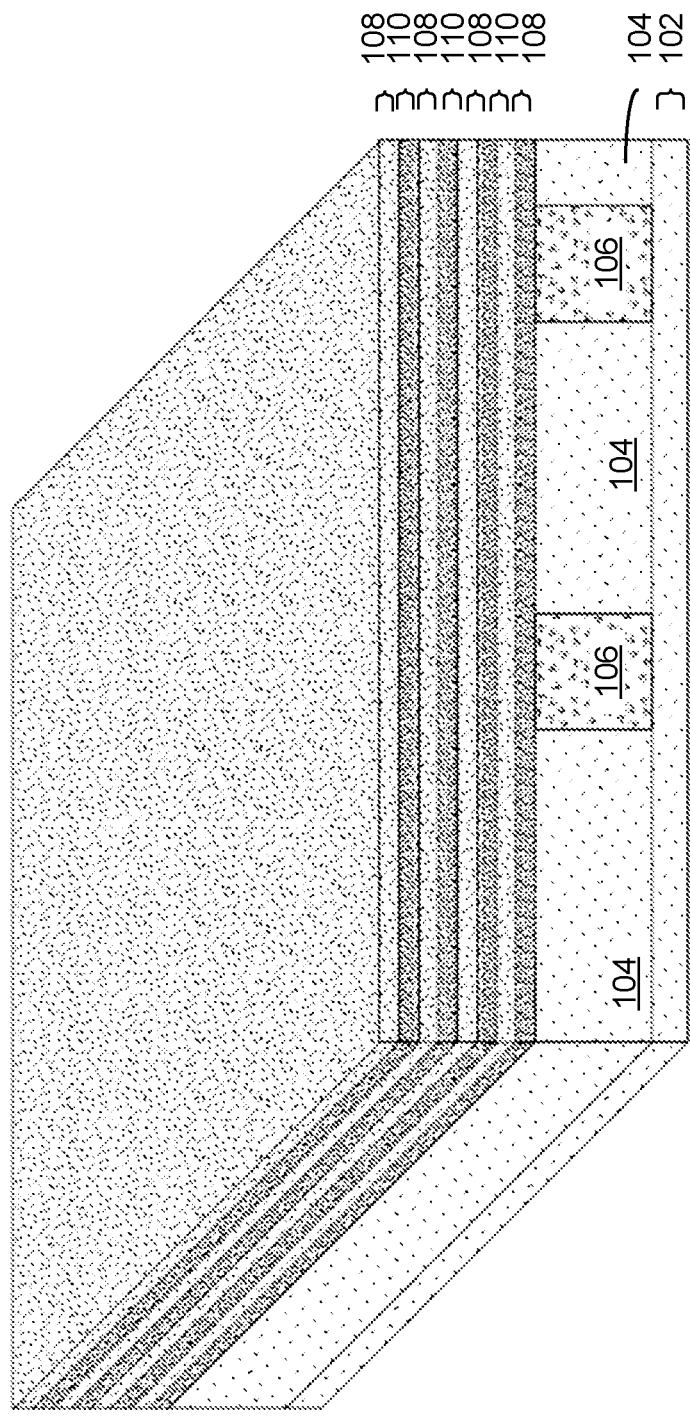
FIG. 2 illustrates an isometric view of the semiconductor structure illustrating depositing alternating layers of insulator layers and conductive layers, according to an exemplary embodiment.

Referring now to FIG. 2, the structure 100 is shown according to an embodiment. Alternating layers of insulator layers 108 and conductive layers 110 may be formed on the structure 100.

The alternating layers of insulator layers 108 and conductive layers 110 may include an insulator layer 108 covering the ILD 104 and the bottom electrode 106, covered by a conductive layer 110, covered by an insulator layer 108, covered by a conductive layer 110, covered by an insulator layer 108, covered by a conductive layer 110, covered by an insulator layer 108. It should be noted that, while a limited number of alternating layers are depicted, any number of alternating layers may be formed. In an embodiment, there may be 100 alternating layers.

The first insulating layer 108 may be formed as described for the ILD 104. In an embodiment, the first insulating layer 108 may be silicon nitride (SiN). The conductive layer 110 may be formed as a blanket deposition and deposited as described for the bottom electrode 106. In an embodiment, the conductive layer 110 may be tin nitride (TiN). In an embodiment, each of the alternating layers may be 5 nm, however thicknesses of each of the alternating layers may be greater than or less than 5 nm, and thicknesses may vary for each of the alternating layers.

Figure 3:
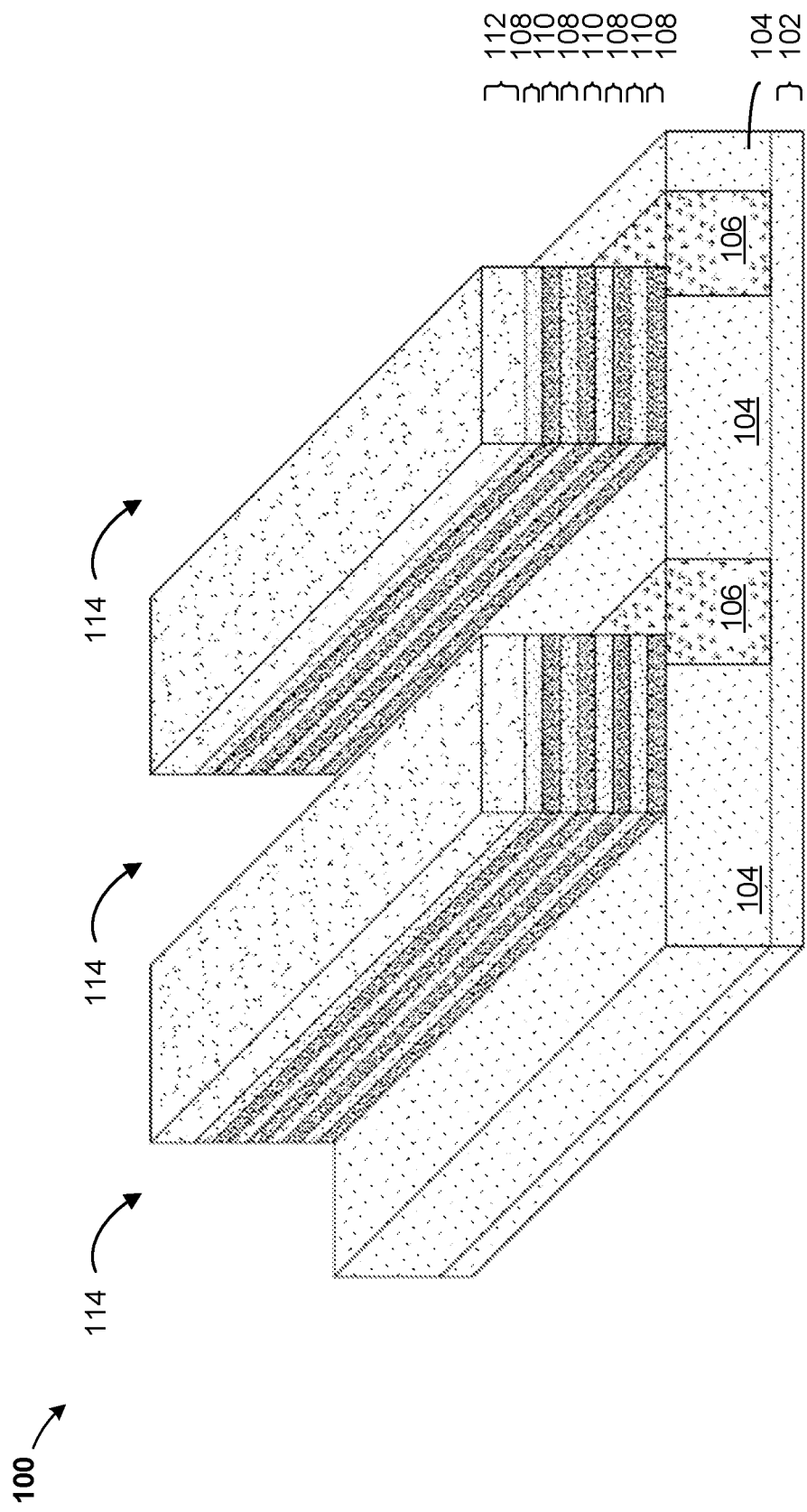
FIG. 3 illustrates an isometric view the semiconductor structure illustrating forming a hard mask and removing portions of the hard mask and portions of the alternating layers of insulator layers and conductive layers, according to an exemplary embodiment.

Referring now to FIG. 3, the structure 100 is shown according to an embodiment. A hard mask 112 may be formed on the structure 100 and a vertical trench 114 may be formed on the structure 100.

The hard mask 112 may be formed over an upper horizontal surface of the alternating layers of insulator layers 108 and conductive layers 110, by methods known in the art.

Conventional lithography process is used to define the vertical trench 114. The vertical trench 114 may be made by removing portions of the hard mask 112 and portions of the alternating layers of insulator layers 108 and conductive layers 110. The vertical trench 114 may be formed using a combination of etching techniques to selectively remove portions of the hard mask 112 and portions of the alternating layers of insulator layers 108 and conductive layers 110 selective to the ILD 104 and the bottom electrode 106 and may be done in multiple steps. Additional removal to form the vertical trench 114 may include removal using an anisotropic etching technique, such as, for example, reactive ion etching (RIE), and stopping at the ILD 104 and the bottom electrode 106. Three vertical trenches 114 are shown in FIG. 3, however, any number of vertical trenches 114 may be formed. In an embodiment, a lower horizontal portion of the vertical trench 114 includes the ILD 104 and the bottom electrode 106. The vertical trench 114 may effectively divide the alternating layers of insulator layers 108 and conductive layers 110.

Figure 4:
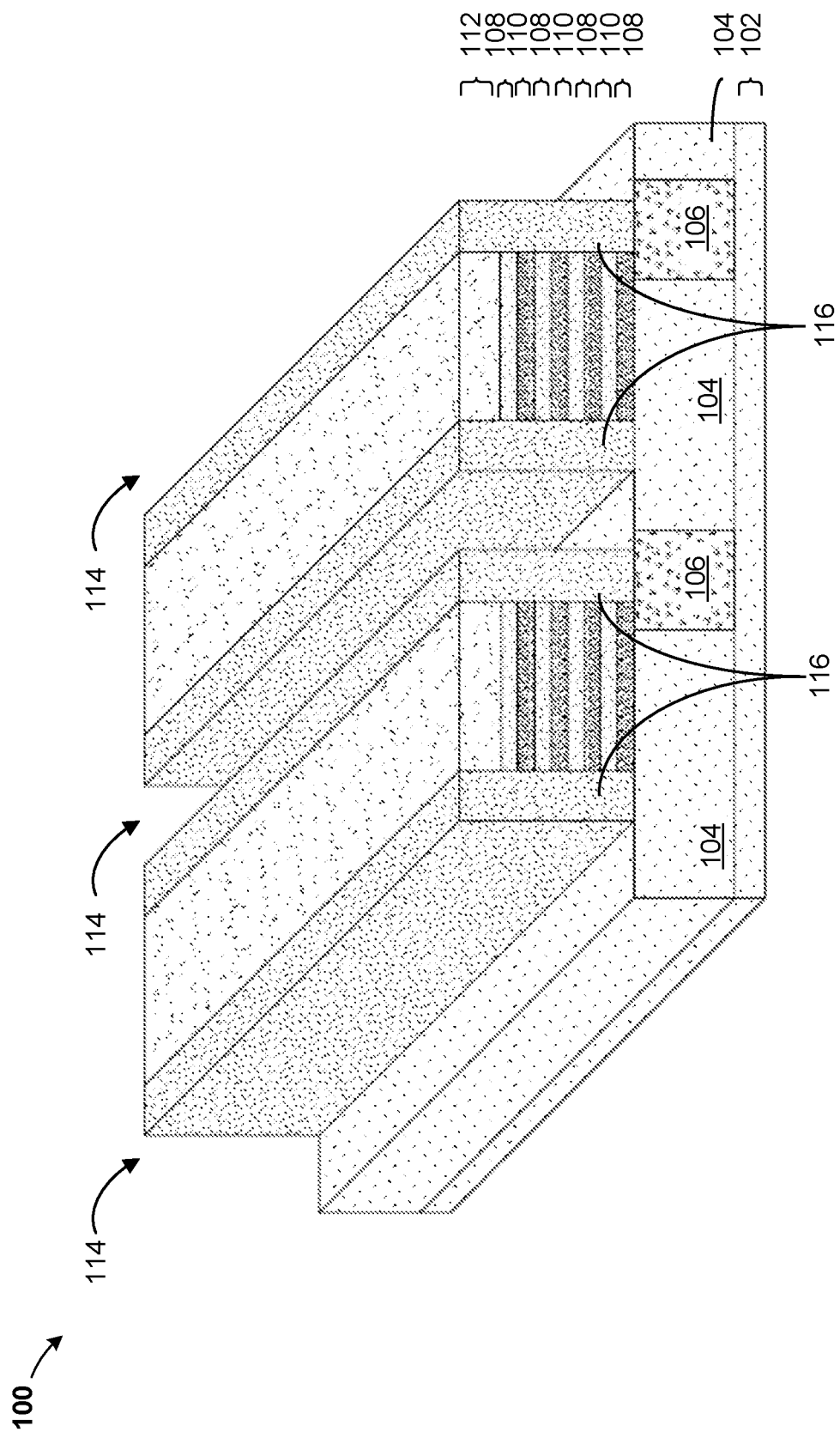
FIG. 4 illustrates an isometric view of the semiconductor structure illustrating forming a side electrode, according to an exemplary embodiment.

Referring now to FIG. 4, the structure 100 is shown according to an embodiment. A side electrode 116 may be formed on the structure 100.

The side electrode 116 may be formed via a blanket deposition of a conductive material followed by an anisotropic etching technique, such as, for example, reactive ion etching (ME), and stopping at the ILD 104 and the bottom electrode 106. The side electrode 116 remains on opposite sides of and surrounding the alternating layers of insulator layers 108 and conductive layers 110 and the hard mask 112. The vertical trench 114 has a resulting smaller volume, as the side electrode 116 fills a portion on either side of the vertical trench 114. The side electrode 116 may be formed from a conductive material layer, such as, for example, copper, tungsten, cobalt, or aluminum. The conductive material layer may be deposited using typical deposition techniques, for example, atomic layer deposition, molecular layer deposition, and chemical vapor deposition. In an embodiment, the side electrode 116 may have a width ranging from about 10 nm to about 100 nm, although a thickness less than 10 nm and greater than 100 nm may be acceptable. In an embodiment, the side electrode 116 may be tin nitride (TiN).

The side electrode 116 on a first side of the alternating layers of insulator layers 108 and conductive layers 110 directly contacts the bottom electrode 106 and provides a continuous contact between the bottom electrode 106, the side electrode 116 and the conductive layers 110, forming a 'comb' shape electrode on a first side of the alternating layers. The lower surface of the side electrode 116 on the first side is adjacent to a portion of an upper surface of the bottom electrode 106.

The side electrode 116 on a second side of the alternating layers of insulator layers 108 and conductive layers 110 does not contact the bottom electrode 106. A lower surface of the side electrode 116 on the second side is adjacent to a portion of an upper surface of the ILD 104.

A portion of a lower surface of the vertical trench 114 is adjacent to a remaining portion of the upper surface of the bottom electrode 106 and a remaining portion of the upper surface of the ILD 104.

Figure 5:
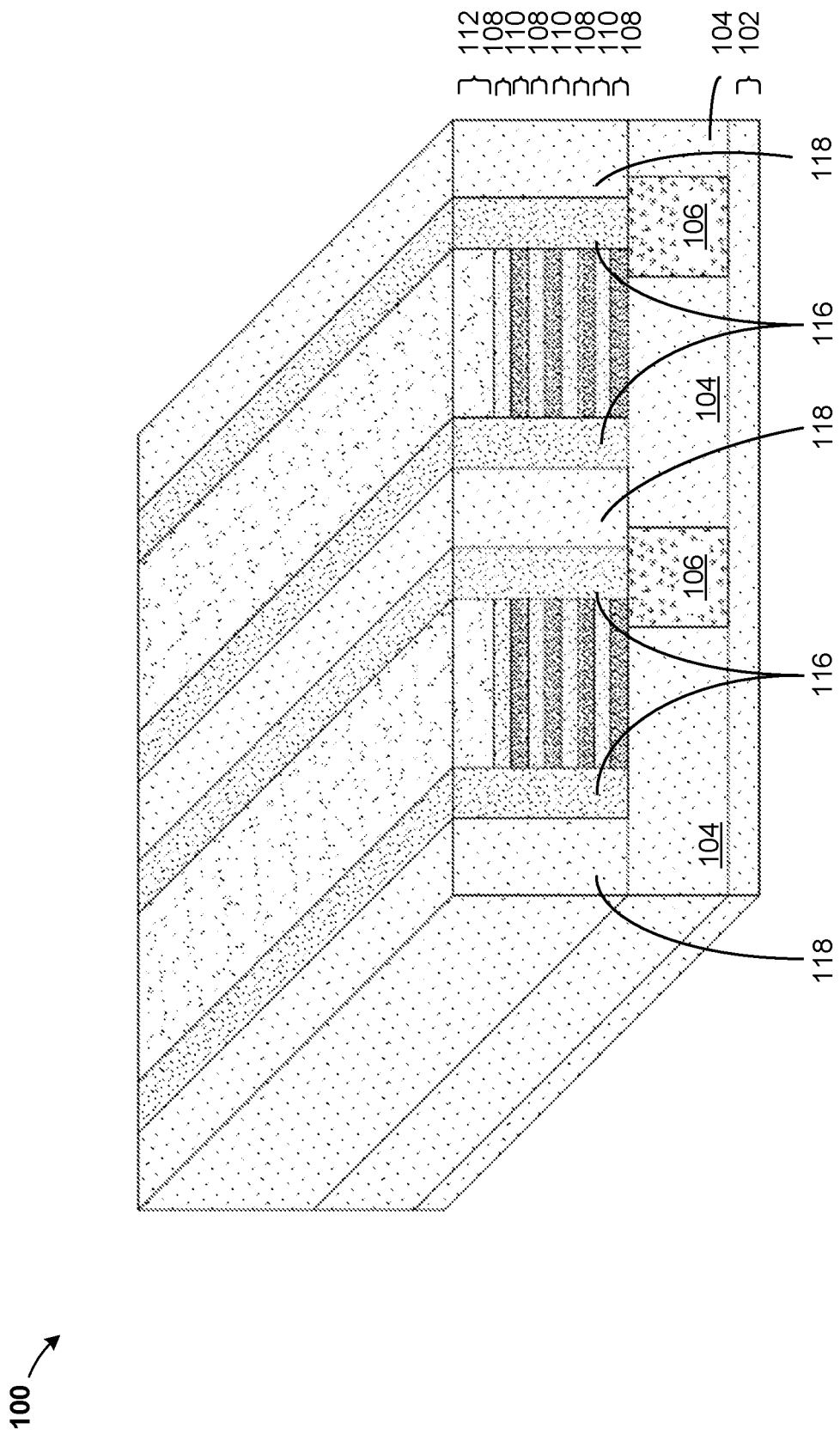
FIG. 5 illustrates an isometric view of the semiconductor structure illustrating forming a dielectric layer, according to an exemplary embodiment.

Referring now to FIG. 5, the structure 100 is shown according to an embodiment. A dielectric 118 may be formed on the structure 100.

The dielectric 118 may be formed and of a material as described regarding the ILD 104. The dielectric 118 may fill remaining spaces of the vertical trench 114, between the side electrodes 116 and above the remaining upper surfaces of the bottom electrode 106 and the ILD 104. A CMP technique may optionally be used to polish the structure 100, providing a substantially smooth and uniform surface of the dielectric 118, the side electrode 116 and the hard mask 112, in preparation for subsequent processing techniques.

Figure 6:
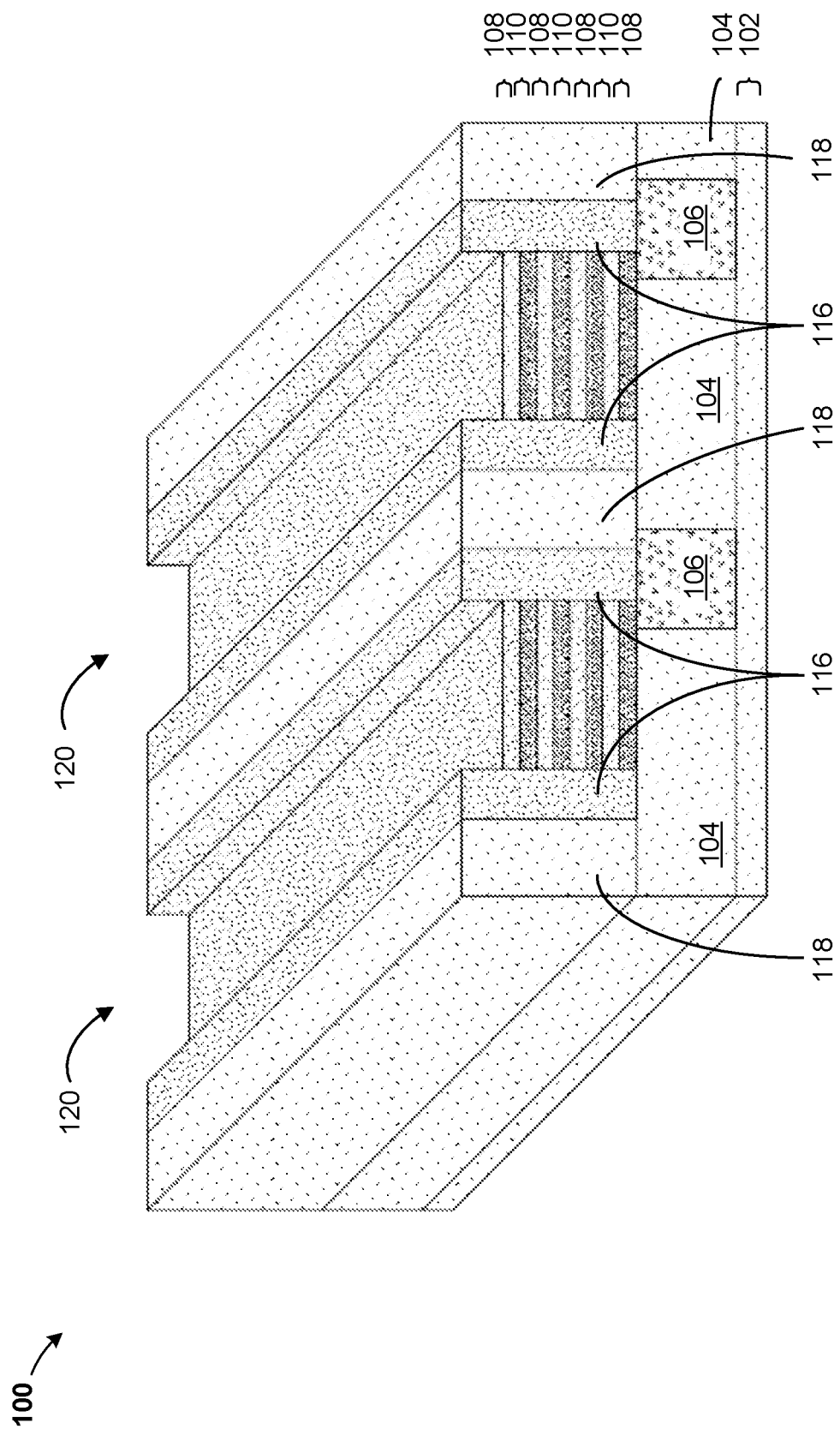
FIG. 6 illustrates an isometric view of the semiconductor structure illustrating removal of the hard mask, according to an exemplary embodiment.

Referring now to FIG. 6, the structure 100 is shown according to an embodiment. The hard mask 112 may be removed, forming an opening 120.

The hard mask 112 may be removed, using known techniques, exposing an upper horizontal surface of the uppermost layer of the alternating layers of insulator layers 108 and conductive layers 110. A lower surface of the opening 120 may be the upper horizontal surface of the uppermost layer of the alternating layers of insulator layers 108 and conductive layers 110. A side surface of the opening 120 may be a portion of a side surface of the side electrode 116.

Figure 7:
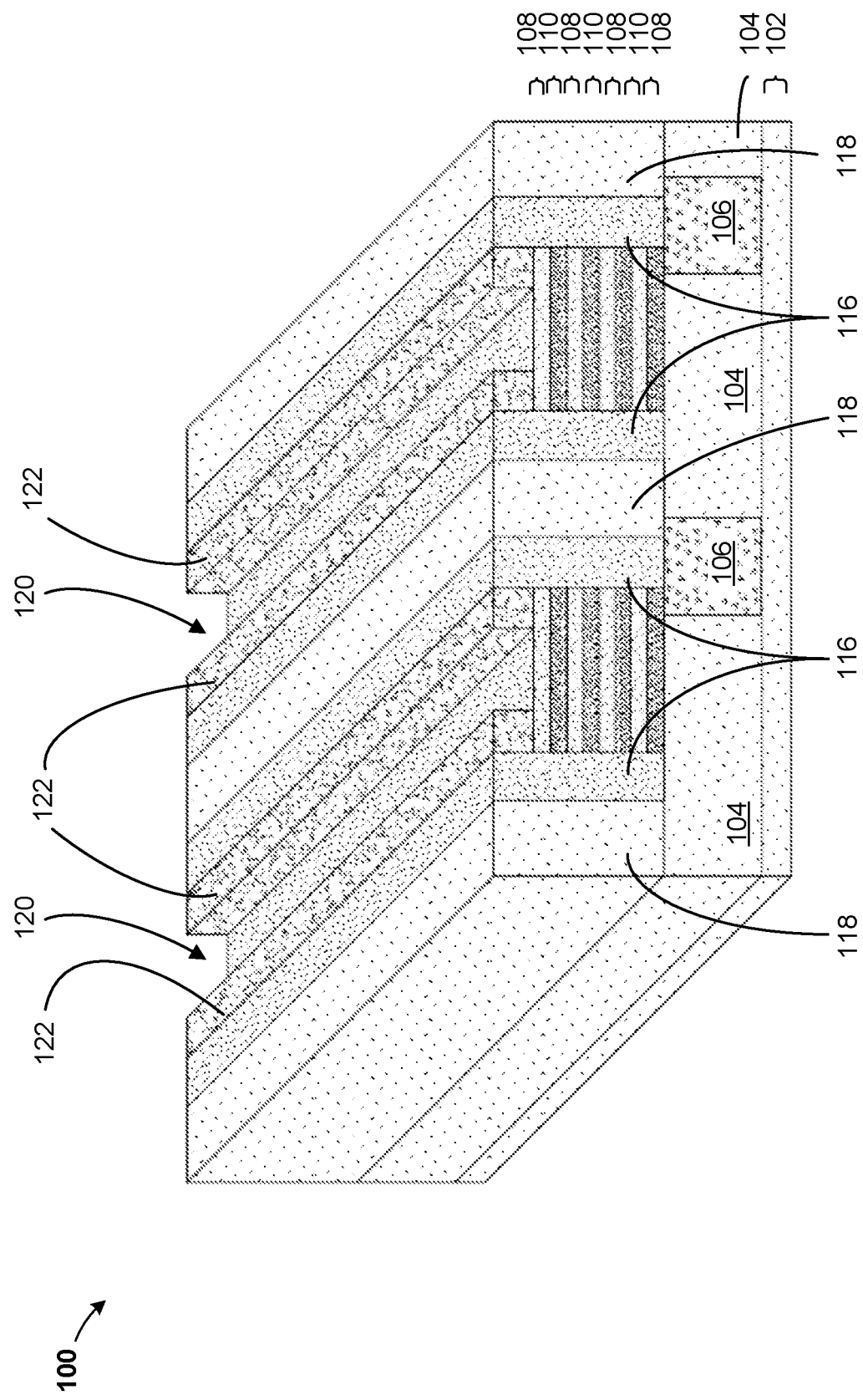
FIG. 7 illustrates an isometric view of the semiconductor structure illustrating forming side spacers, according to an exemplary embodiment.

Referring now to FIG. 7, the structure 100 is shown according to an embodiment. Side spacers 122 may be formed.

The side spacers 122 may be formed on opposite sides of the opening 120, along the side electrode 116, decreasing a volume of the opening 120. The side spacers 122 may be formed and of a material as described regarding the ILD 104, followed by an anisotropic etching technique, such as, for example, reactive ion etching (ME), and stopping at the uppermost horizontal surface of the alternating layers of insulator layers 108 and conductive layers 110. A lower horizontal surface of the side spacers 122 may be a portion of the uppermost horizontal surface of the alternating layers. A first side of each of the side spacers 122 may be a portion of a side surface of the side electrode 116. A second side of each of the side spacers 122 may be the opening 120.

Figure 8:
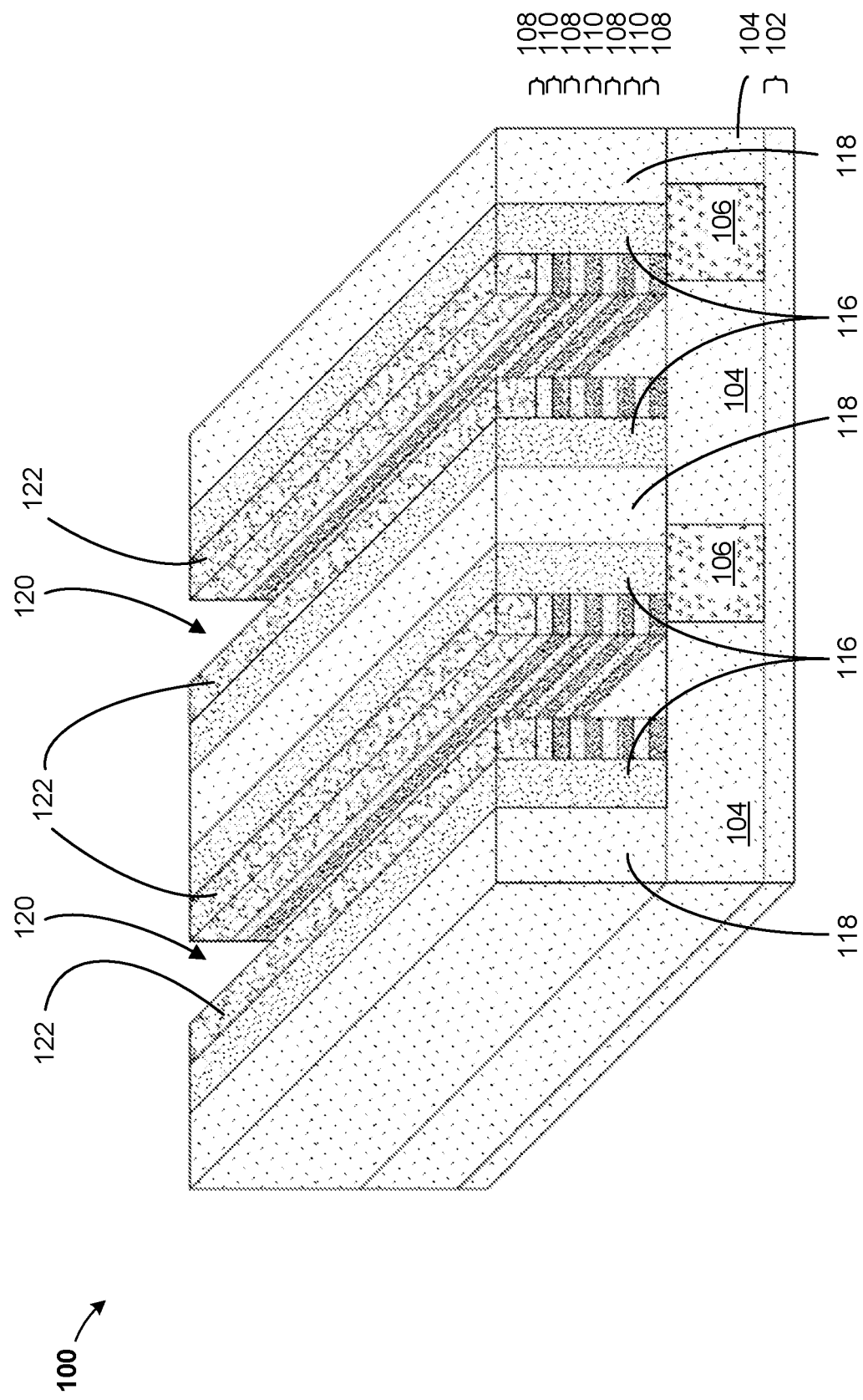
FIG. 8 illustrates an isometric view of the semiconductor structure illustrating removing additional portions of the alternating layers of insulator layers and conductive layers, according to an exemplary embodiment.

Referring now to FIG. 8, the structure 100 is shown according to an embodiment. A portion of the alternating layers of insulator layers 108 and conductive layers 110 may be removed.

The portion of the alternating layers of insulator layers 108 and conductive layers 110 may be removed between the side spacers 122, increasing a depth of the opening 120. A remaining portion of the alternating layers which are not removed may be protected by the side spacers 122 which protect the remaining portions of the alternating layers. The side spacers 122 may provide a self-aligned patterning which helps to eliminate overlay or critical dimension variation, resulting in uniform comb electrodes on each side of the alternating layers.

A lower surface of the opening 120 may be a portion of an upper surface of the ILD 104. Each side surface of the opening 120 may be side surfaces of the alternating layers of insulator layers 108 and conductive layers 110, and side surfaces of the side spacer 122.

Figure 9:
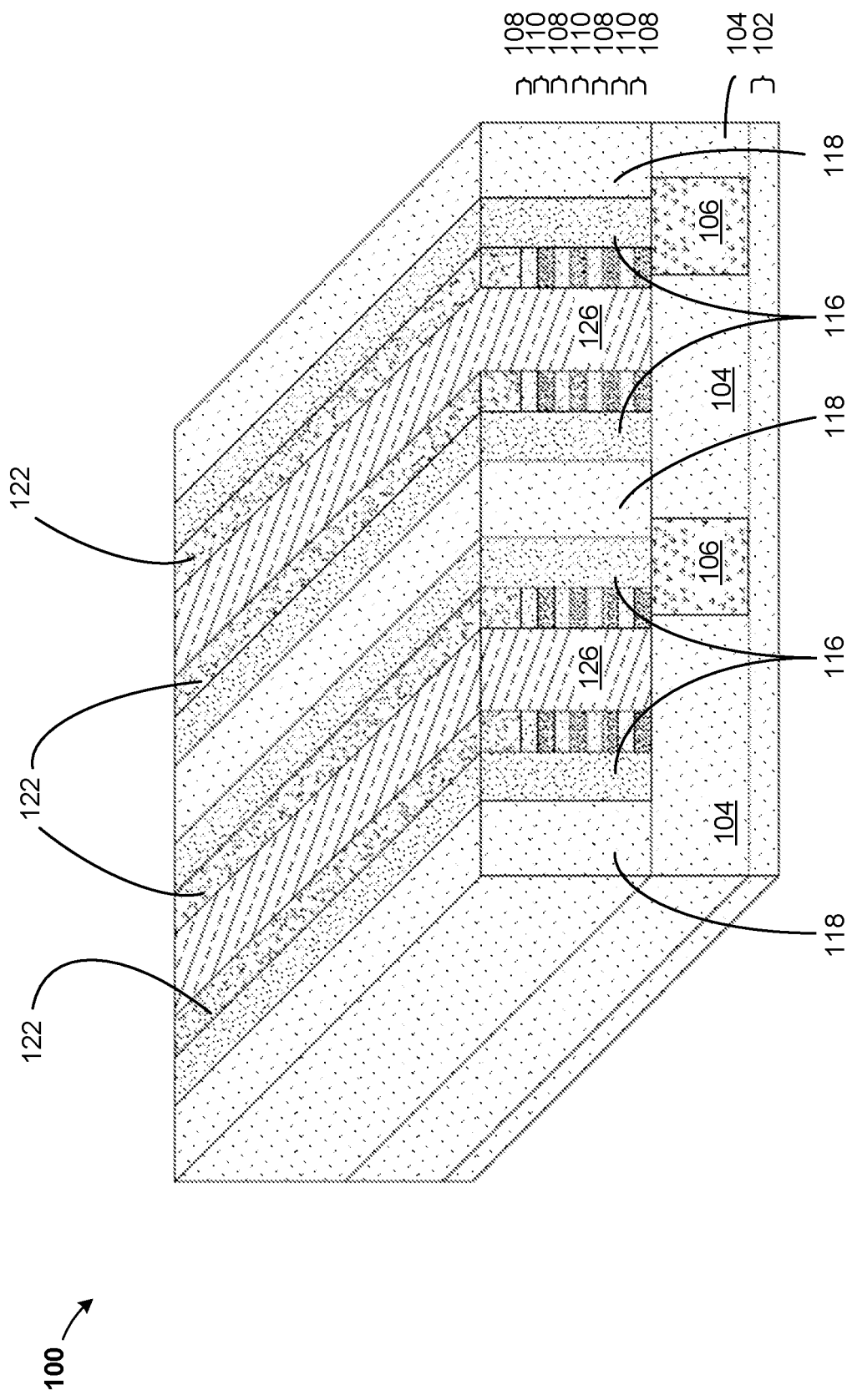
FIG. 9 illustrates an isometric view of the semiconductor structure illustrating formation of a resistive switching material layer, according to an exemplary embodiment.

Referring now to FIG. 9, the structure 100 is shown according to an embodiment. A resistance switching material layer 126 may be formed in the structure 100.

The resistance switching material layer 126 may be blanket deposited on top of the structure 100 and directly on the portion of the upper surface of the ILD between the alternating layers. The resistance switching material layer 126 may fill the opening 120. A vertical side surface of the resistance switching material layer 126 may be adjacent to vertical side surfaces of the alternating layers of insulator layers 108 and conductive layers 110, and a side surface of the side spacer 122.

Conventional deposition processes, such as electroplating, electroless plating, chemical vapor deposition, physical vapor deposition, or a combination of methods, can be used to deposit the resistance switching material layer 126 on the structure 100. According to embodiments of the present invention, the resistance switching material layer 126 may be formed of phase change materials such as a mixture of gallium (Ga) and antimony (Sb) and at least one of tellurium (Te), silicon (Si), germanium (Ge), arsenic (As), selenium (Se), indium (In), tin (Sn), bismuth (Bi), silver (Ag), gold (Au), and antimony (Sb). It is to be appreciated that the preceding list is merely illustrative and, thus, other elements can also be used to form the resistance switching material layer 126, while maintaining the spirit of the present principles disclosed herein. In an embodiment, the resistance switching material layer 126 may be made of a chalcogenide alloy such as germanium-antimony-tellurium (GST). According to another embodiment, the resistance switching material layer 126 may also be made of a transition metal oxide having multiple resistance states. For example, the resistance switching material layer 126 may be made of at least one material selected from the group consisting of NiO, $TiO_2$, HfO, $Nb_2O_5$, ZnO, $WO_3$, and CoO or GST ($Ge_2Sb_2Te_5$) or PCMO (PrxCa1-xMnO3). In yet another embodiment, the phase change material may be a chemical compound including one or more elements selected from the group consisting of sulfur (S), selenium (Se), tellurium (Te), arsenic (As), antimony (Sb), germanium (Ge), tin (Sn), indium (In), and silver (Ag). In an embodiment, the resistance switching material layer 126 may have a thickness ranging from about 10 nm to about 100 nm, although a thickness less than 10 nm and greater than 100 nm may be acceptable.

A CMP technique may optionally be used to polish the structure 100, providing a substantially smooth and uniform upper surface of the resistance switching material layer 126, the side spacers 122, the side electrode 116 and the dielectric 118.

Figure 10:
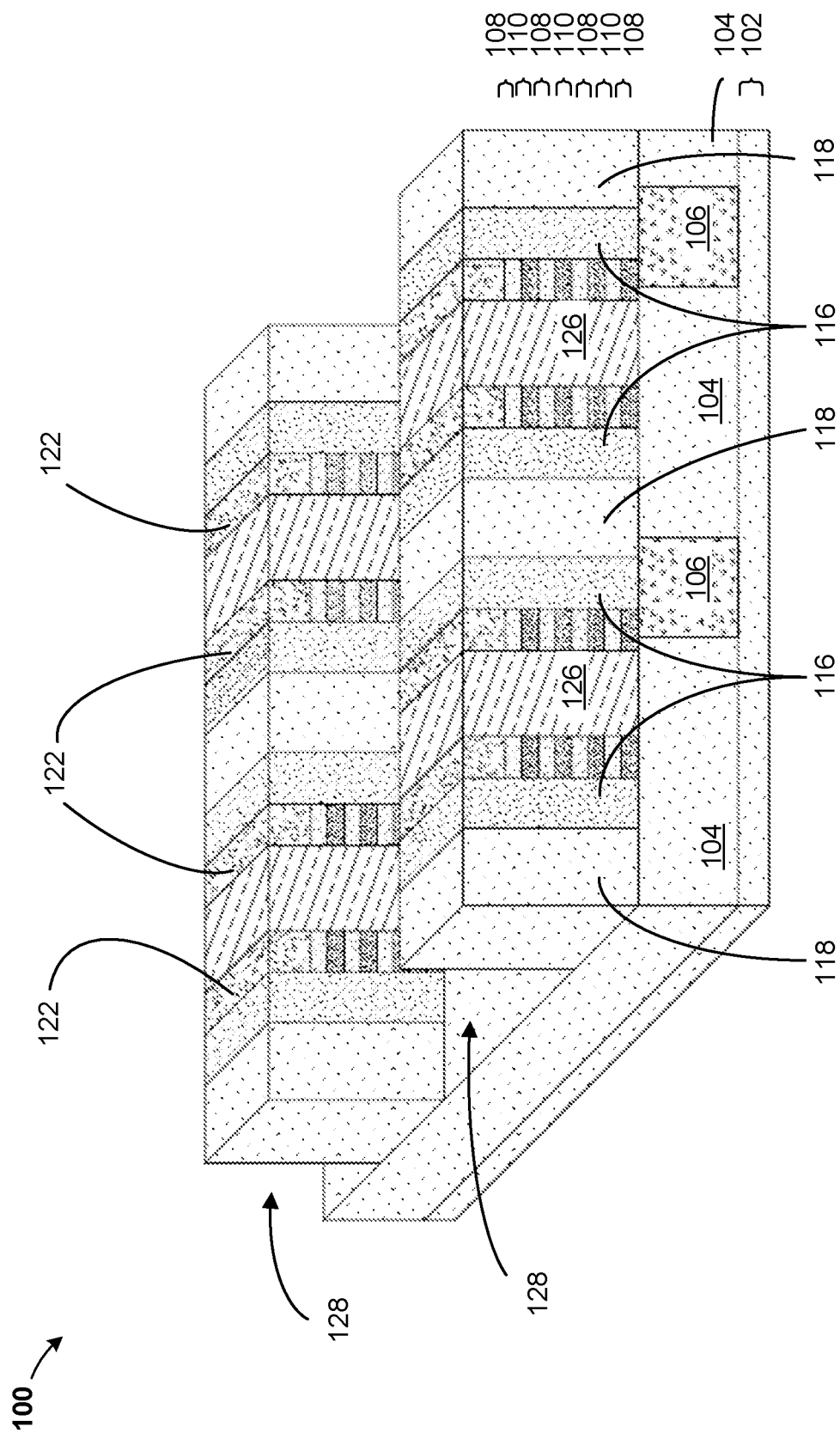
FIG. 10 illustrates an isometric view of the semiconductor structure illustrating removal of additional portions of the alternating layers of insulator layers and conductive layers, portions of the resistive switching material layer, portions of the side spacer and portions of the dielectric, according to an exemplary embodiment.

Referring now to FIG. 10, the structure 100 is shown according to an embodiment. The structure 100 may be patterned into stripes orthogonal to the bottom electrode 106, forming a vertical trench 128.

Conventional lithography process is used to define the vertical trench 128. The vertical trench 128 may be made by removing portions of the dielectric 118, portions of the side electrode 116, portions of the side spacers 122, portions of the resistance switching material layer 126 and portions of the alternating layers of insulator layers 108 and conductive layers 110. The vertical trench 128 may be formed using a combination of etching techniques to selectively remove portions of the hard mask 112 and portions of the dielectric 118, portions of the side electrode 116, portions of the side spacers 122, portions of the resistance switching material layer 126 and portions of the alternating layers of insulator layers 108 and conductive layers 110 and may be done in multiple steps. Additional removal to form the vertical trench 128 may include removal using an anisotropic etching technique, such as, for example, reactive ion etching (ME), and stopping at the ILD 104 and the bottom electrode 106. Two vertical trenches 128 are shown in FIG. 10, however, any number of vertical trenches 128 may be formed. In an embodiment, a lower horizontal portion of the vertical trench 128 includes the ILD 104 and the bottom electrode 106.

Figure 11:
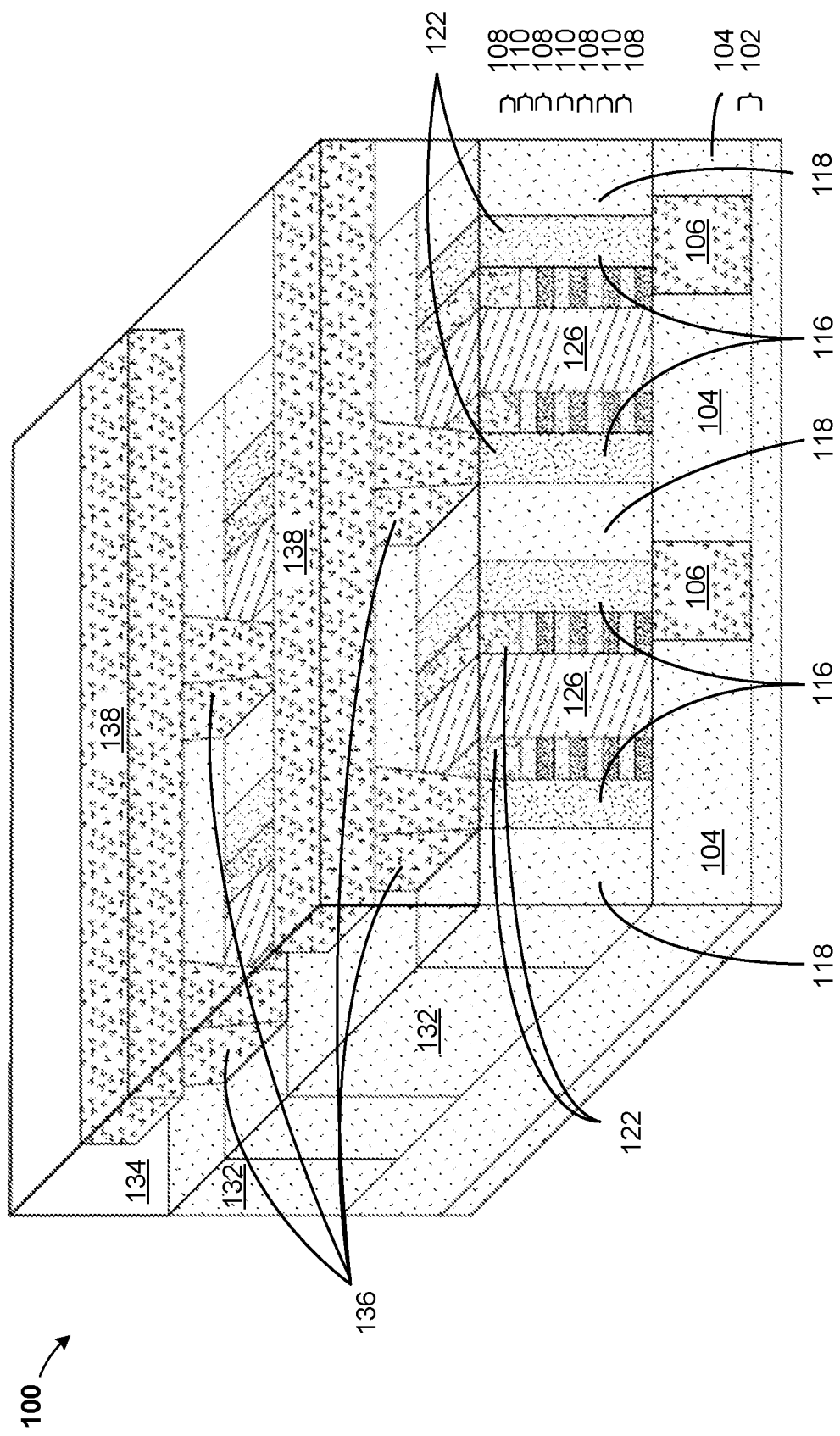
FIG. 11 illustrates an isometric view of the semiconductor structure illustrating formation of vias and a top electrode, according to an exemplary embodiment.

Referring now to FIG. 11, the structure 100 is shown according to an embodiment. An ILD 132, an ILD 134, vias 136 and a top electrode 138 may be formed on the structure 100.

The ILD 132 can be deposited across the top of the structure 100 in a blanket layer using any known deposition techniques, such as, for example, chemical vapor deposition, atomic layer deposition, physical layer deposition, or some combination thereof. More specifically, the ILD 132 may be deposited within and generally fill the vertical trench 128. The ILD 134 can be deposited across the top of the structure 100 in a blanket layer as described for the ILD 132. The ILD 134 and the ILD 132 may be separately deposited or may be deposited at the same time. The ILD 132 and the ILD 134 each may be one or more layers. The ILD 132 and the ILD 134 may include materials, such as, for example, an oxide, a nitride, or some combination thereof. In an embodiment, the ILD 132 and the ILD 134 may include an oxide, such as, silicon oxide. In an alternate embodiment, the ILD 132 and the ILD 134 may include a nitride, such as, silicon nitride.

The ILD 134 as shown in the FIG. 11 is shown as a transparent material for illustration purposes only.

A chemical mechanical planarization technique may optionally be used to polish the ILD 134 and provide a substantially smooth and uniform surface in preparation for subsequent processing techniques.

Openings (not shown), may be made in the ILD 134 and the ILD 132 for subsequent formation of the vias 136 and the top electrode 138. The vias 136 and the top electrode 138 may be formed from a conductive material layer, such as, for example, copper, tungsten, cobalt, or aluminum. The conductive material layer may be deposited using typical deposition techniques, for example, atomic layer deposition, molecular layer deposition, and chemical vapor deposition. The vias 136 and the top electrode 138 may be formed separately or at the same time. The vias 136 and the top electrode 138 may be formed in one or more steps. As shown in FIG. 11, there are four vias 136 and two top electrodes 138, however, there may be any number of vias 136 and top electrodes 138 in the structure 100. A CMP technique may optionally be used to polish the structure 100 such that upper surfaces of the top electrode 138 and the ILD 134 are substantially coplanar and provide a substantially smooth and uniform surface in preparation for subsequent processing techniques. Each of the vias 136 may contact the side electrode 116 on the second side of the alternating layers of insulator layers 108 and conductive layers 110, connecting to the top electrode 138.

The structure 100 depicts four individual cells. There may be any number of individual cells in the structure 100. Each individual cell is connected to a bottom electrode 106, which may be a bit line, and a top electrode 138, which may be a word line and is orthogonal to the bottom electrode 106. Each individual cell may include vertically aligned portions of the resistive switching material layer 126 surrounded by alternating layers of insulator layer 108 and conductive layer 110. The bottom electrode 106 connected with the side electrode 116 (as a shaft of a comb) connected with the alternating layers of conductive layers 110 on a first side of the resistive switching material layer 126 forms a comb shape electrode with teeth of the comb shape, or the alternating layers of conductive layers 110, each adjacent to the resistive switching material layer 126.

The top electrode 138 connected with the via 136 connected to the side electrode 116 connected with the alternating layers of conductive layers 110 on a second side of the resistive switching material layer 126 forms a comb shape electrode on a second side of the resistive switching material layer 126, with teeth of the comb shape or the alternating layers of conductive layers 110 each adjacent to the resistive switching material layer 126.

Each individual cell has a comb shape connection to the top electrode 138 and a comb shape connection to the bottom electrode 106.

In general, a size of the individual cells 101 will mimic existing phase change memory cells and be similarly limited based on a footprint of a phase change memory cell. The presented structure may have a smaller footprint per cell allowing get multiple memory bits per memory cell.

Although only four individual cells are shown, it should be noted that the structure 100 would typically include an array of several thousand cells all formed according the methods disclosed herein.

The individual cell is a resistive switching material memory cell with comb-shape electrodes. The comb shape electrodes are formed from the conductive layers 110 of alternating layers of insulator layers 108 and conductive layers 110 connected to a side electrode, which are connected to a bottom electrode 106 on one side of the individual cell, and are connected to a top electrode 138 on another side of the individual cell. A resistance switching material layer 126 is between the comb shape electrodes.

The resistance switching material layer 126 may store two different memory states due to differences in resistivity between the resistance switching material layer 126 crystalline phase which is a low resistive state, and the amorphous phase which is a high resistive state. An individual cell may be selected by providing a voltage between a bottom electrode 106 and a top electrode 138 of the particular individual cell. Current may flow between the bottom electrode 106 and the top electrode 138 allowing for the current to pass through resistance switching material layer 126. Differences in a resulting current, due to the resistive switching material layer 126 being in either the low resistive state or the high resistive state, allow for determination of one of the two different memory states.

In an embodiment, the resistive switching material layer 126 may store more than two different memory states by controlling an amount of resistive switching material which is in a crystalline phase and a remaining amount of resistive switching material in an amorphous state, thus controlling a resistance through the resistive switching material. This results in differences in current flowing from a first electrode on a first side of the resistive switching material to a second electrode on a second side of the resistance switching material when a constant voltage is applied to the two electrodes when reading the memory cell.

According to an alternative embodiment, the resistance switching layer 126 may alternatively include a material suitable for an alternative type of non-volatile memory cell such as resistive random access memory (ReRAM), conductive bridging random access memory (CBRAM) or ferroelectric tunnel junction (FTJ). For ReRAM, metal oxides, such as hafnium oxide, tantalum oxide, titanium oxide, aluminum oxide, silicon oxide, are typically used and oxygen vacancies in the oxide serve as building block of switching filament. For CBRAM, metal cations, such as copper, silver, and mixture thereof are used instead of oxygen vacancies. For FTJ, hafnium based ferroelectric films are used for the switching layer, for example hafnium oxide and hafnium oxide with dopants such as aluminum, zirconium, silicon, nitrogen, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
a bottom electrode on a substrate;
a first side electrode vertically aligned above the bottom electrode;
a set of alternating layers of insulator layers and conductive layers horizontally adjacent to the first side electrode; and
a resistance switching material layer, the resistance switching material layer horizontally adjacent to a first side of the set of alternating layers.

2. The structure according to claim 1, further comprising:
a second set of alternating layers of insulator layers and conductive layers horizontally adjacent to a second side of the resistance switching material layer, the second side opposite the first side; and
a second side electrode horizontally adjacent to the second set of alternating layers; and
a top electrode vertically aligned above the second side electrode.

3. The structure according to claim 2, further comprising:
a via between the second side electrode and the top electrode.

4. The structure according to claim 2, wherein
the top electrode is orthogonal to the bottom electrode.

5. The structure according to claim 2, further comprising:
an array of structures, wherein the structures are connected together forming word lines and bit lines.

6. The structure according to claim 1, wherein
the substrate comprising layers of connections and transistors.

7. A structure comprising:
a first set of alternating layers of insulator layers and conductive layers on a first side of a resistance switching material layer and a second set of alternating layers of insulator layers and conductive layers on a second side of the resistance switching material layer;
a first side electrode adjacent to the first set of alternating layers and vertically aligned above a bottom electrode; and
a second side electrode adjacent to the second set of alternating layers and vertically aligned below a top electrode.

8. The structure according to claim 7, further comprising:
a via between the second side electrode and the top electrode.

9. The structure according to claim 7, wherein
the top electrode is orthogonal to the bottom electrode.

10. The structure according to claim 7, further comprising:
an array of structures, wherein the structures are wired together forming word lines and bit lines.

11. The structure according to claim 7, further comprising
a substrate comprising layers of connections and transistors below the first set of alternating layers of insulator layers and conductive layers.

* * * * *